(12) United States Patent
Zhu

(10) Patent No.: US 12,166,028 B2
(45) Date of Patent: Dec. 10, 2024

(54) SEMICONDUCTOR STRUCTURE AND METHOD FOR PREPARING SEMICONDUCTOR STRUCTURE

(71) Applicant: CHANGXIN MEMORY TECHNOLOGIES, INC., Hefei (CN)

(72) Inventor: Xiao Zhu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 472 days.

(21) Appl. No.: 17/506,744

(22) Filed: Oct. 21, 2021

(65) Prior Publication Data

US 2022/0216196 A1 Jul. 7, 2022

Related U.S. Application Data

(63) Continuation of application No. PCT/CN2021/108215, filed on Jul. 23, 2021.

(30) Foreign Application Priority Data

Jan. 4, 2021 (CN) .......................... 202110003765.0

(51) Int. Cl.
- *H01L 27/01* (2006.01)
- *H01L 21/768* (2006.01)
- *H01L 23/528* (2006.01)
- *H01L 23/532* (2006.01)

(52) U.S. Cl.
CPC ........ *H01L 27/01* (2013.01); *H01L 21/76802* (2013.01); *H01L 21/7682* (2013.01); *H01L 23/5283* (2013.01); *H01L 23/53295* (2013.01)

(58) Field of Classification Search
CPC .... H10B 12/48; H10B 12/482; H10B 12/485; H10B 12/0335; H10B 12/0385
See application file for complete search history.

(56) References Cited

U.S. PATENT DOCUMENTS

| | | | |
|---|---|---|---|
| 8,779,546 B1 | 7/2014 | Tsukamoto et al. | |
| 9,666,585 B2 | 5/2017 | Jung et al. | |
| 10,665,592 B2 | 5/2020 | Song et al. | |
| 2019/0164975 A1 | 5/2019 | Song et al. | |
| 2019/0333918 A1* | 10/2019 | Kim ..................... | H10B 12/31 |
| 2020/0203347 A1 | 6/2020 | Song et al. | |
| 2021/0027832 A1 | 1/2021 | Wang et al. | |

FOREIGN PATENT DOCUMENTS

| | | |
|---|---|---|
| CN | 108206184 A | 6/2018 |
| CN | 108346660 A | 7/2018 |
| CN | 108777253 A | 11/2018 |
| CN | 109841595 A | 6/2019 |
| CN | 110098175 A | 8/2019 |
| CN | 111640744 A | 9/2020 |
| CN | 111900164 A | 11/2020 |
| KR | 101564052 B1 | 10/2015 |

* cited by examiner

*Primary Examiner* — Moazzam Hossain
(74) *Attorney, Agent, or Firm* — Syncoda LLC; Feng Ma

(57) ABSTRACT

A semiconductor structure and a method for preparing the semiconductor structure are provided. The semiconductor structure includes a substrate, a storage node contact and a capacitor isolating structure. The storage node contact is located on the substrate, and the capacitor isolating structure is located on the substrate, covers a side wall of the storage node contact and includes a first air gap.

9 Claims, 10 Drawing Sheets

SEMICONDUCTOR STRUCTURE AND METHOD FOR PREPARING SEMICONDUCTOR STRUCTURE

CROSS-REFERENCE TO RELATED APPLICATION

This is a continuation application of International Patent Application No. PCT/CN2021/108215, filed on Jul. 23, 2021, which claims priority to Chinese Patent Application No. 202110003765.0, filed on Jan. 4, 2021 and entitled "Semiconductor Structure and Method for Preparing Semiconductor Structure". The disclosures of International Patent Application No. PCT/CN2021/108215 and Chinese Patent Application No. 202110003765.0 are incorporated by reference herein in their entireties.

BACKGROUND

In a semiconductor structure, for example, a Dynamic Random Access Memory (DRAM) device, as the device is scaled down continuously, a separation distance between capacitors becomes smaller and smaller, and an inductive coupling effect between adjacent capacitor contact holes is also enhanced continuously. An isolating structure adopted in the related art is limited in insulating property, such that the service performance of the semiconductor structure is affected.

SUMMARY

The disclosure relates to the technical field of semiconductors, in particular to a semiconductor structure and a method for preparing the semiconductor structure.

The disclosure provides a semiconductor structure and a method for preparing the semiconductor structure to improve performance of the semiconductor structure.

According to a first aspect of the disclosure, there is provided a semiconductor structure including a substrate, a storage node contact and a capacitor isolating structure.

The storage node contact is located on the substrate.

The capacitor isolating structure is located on the substrate, and covers a side wall of the storage node contact. The capacitor isolating structure includes a first air gap.

According to a second aspect of the disclosure, there is provided a method for preparing a semiconductor structure including the following operations.

A substrate is provided.

A plurality of storage node contacts are formed on the substrate.

Capacitor isolating structures each formed between the storage node contacts are formed on the substrate.

Each of the capacitor isolating structures includes a first air gap.

BRIEF DESCRIPTION OF THE DRAWINGS

Various objects, features, and advantages of the disclosure will become more apparent from the following detailed description of preferred embodiments of the disclosure considered in conjunction with the accompanying figures. The figures are merely exemplary illustrations of the disclosure and are not necessarily drawn to scale. In the figures, like reference numerals refer to the same or similar components throughout. In the drawings.

DETAILED DESCRIPTION

Exemplary embodiments that embody the features and advantages of the disclosure will be described in detail in the following description. It will be appreciated that the disclosure may have various changes in different embodiments without departing from the scope of the disclosure, and that the description and drawings are illustrative in nature and are not intended to limit the disclosure.

In the following description of various exemplary embodiments of the disclosure, reference is made to the accompanying drawings, which form a part of the disclosure, and various exemplary structures, systems, and steps capable of implementing various aspects of the disclosure are shown by way of example. It will be appreciated that other specific solutions of components, structures, exemplary devices, systems, and steps may be utilized and structural and functional modifications may be made without departing from the scope of the disclosure. Moreover, although the terms "on", "between", "in", etc. may be used in this specification to describe different exemplary features and elements of the disclosure, these terms are used herein for convenience only, e.g., in accordance with the orientation of the examples in the figures. Nothing in this specification should be construed as requiring a particular three-dimensional orientation of the structure to fall within the scope of the disclosure.

Figure 1:
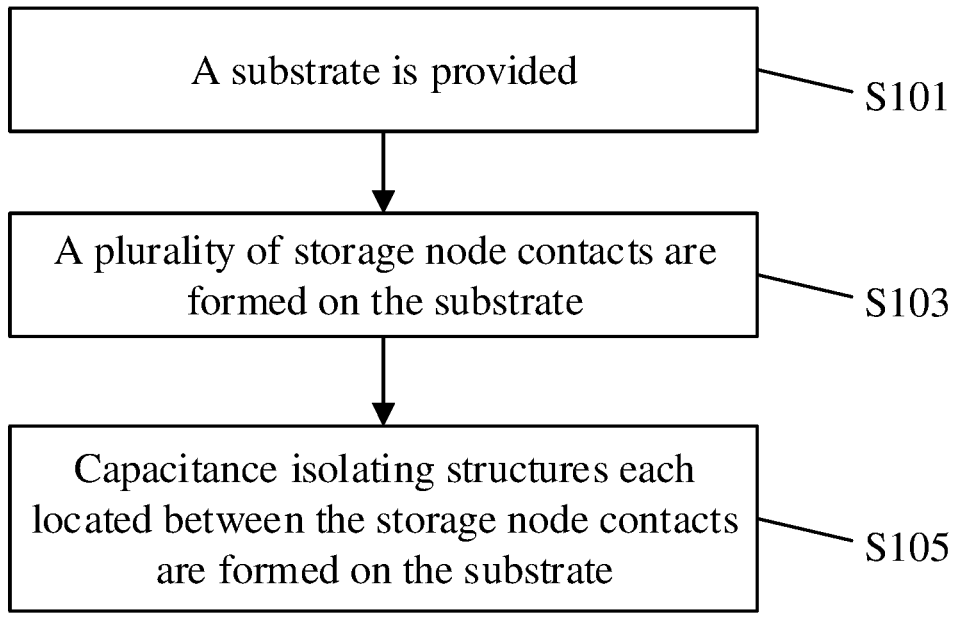
FIG. 1 is a schematic flowchart of a method for preparing a semiconductor structure according to an exemplary embodiment.

An embodiment of the disclosure provides a method for preparing a semiconductor structure. Referring to FIG. 1, the method for preparing a semiconductor structure includes the following operations.

At S101, a substrate 10 is provided.

At S103, a plurality of storage node contacts 20 are formed on the substrate 10.

At S105, capacitor isolating structures 30 each formed between the storage node contacts 20 are formed on the substrate 10.

The capacitor isolating structures 30 each include a first air gap 31.

According to the method for preparing a semiconductor structure of an embodiment of the disclosure, the storage node contacts 20 and the capacitor isolating structures 30 are formed on the substrate 10 and each capacitor isolating structure 30 formed between the storage node contacts 20 includes the first air gap 31, such that an inductive coupling effect is reduce and performance of the semiconductor structure is improved.

It is to be noted that each capacitor isolating structure 30 formed between the storage node contacts 20 forms a side wall isolating structure of the storage node contact 20, and air has the characteristic of minimum dielectric constant, the capacitor isolating structure 30 with the first air gap 31 therefore may reduce the inductive coupling effect and improve the performance of the semiconductor structure.

Specifically, the substrate 10 may be formed from a silicon-containing material. The substrate 10 may be formed from any proper materials, for example, including at least one of silicon, monocrystalline silicon, polycrystalline silicon, amorphous silicon, silicon-germanium, monocrystalline silicon-germanium, polycrystalline silicon-germanium or carbon-doped silicon.

In an embodiment, before the storage node contacts 20 are formed, the method for preparing a semiconductor structure further includes the following operations. An isolating part 71 is formed on the substrate 10. The isolating part 71 on the substrate 10 is etched by a pitch multiplication technology or other pattern transfer technologies to form trenches 72. A first isolating dielectric layer 73 covering a side wall of each trench 72 is formed in each trench 72. A first insulating layer 74 is formed in each trench 72, the first insulating layer 74 on the surface is removed by an etching process and meanwhile, a part of the first insulating layer 74 in each trench 72 is removed, such that the first insulating layer 74 fills a lower portion of each trench 72. A second isolating dielectric layer 75 fills up each trench 72 until an upper portion of the trench 72. The entire structure is etched together by etching. The isolating part 71 on each of two sides of each first isolating dielectric layer 73 is removed to form first openings 70. The storage node contacts 20 are formed in first openings 70.

Figure 2:
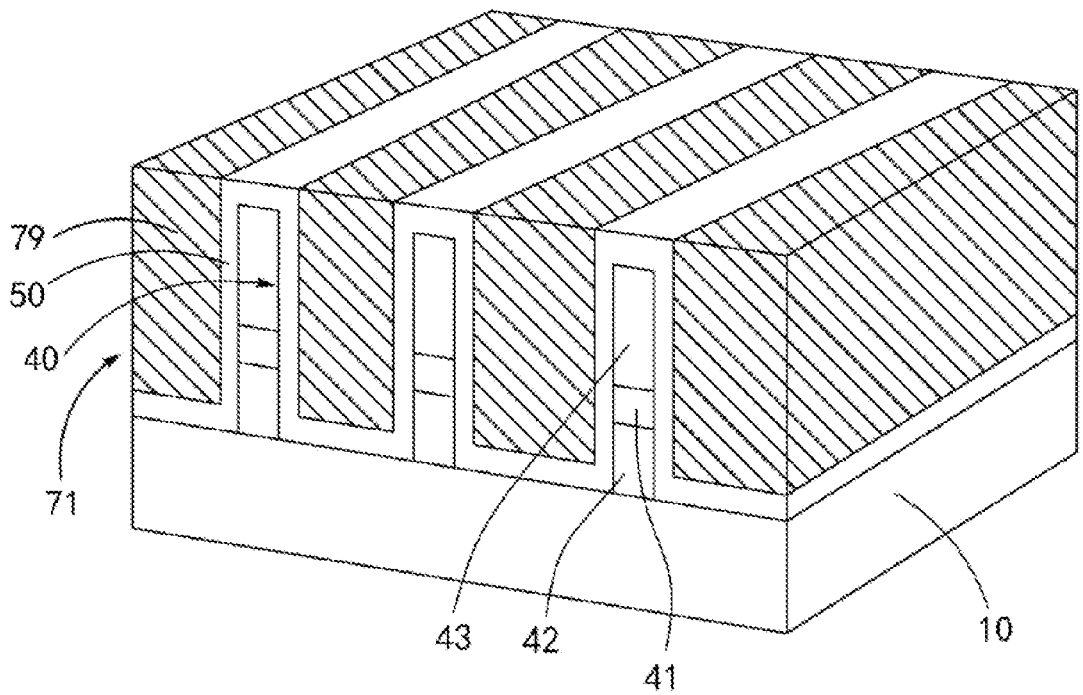
FIG. 2 is a structural schematic diagram of a first viewing angle of forming an isolating part formed by a method for preparing a semiconductor structure according to an exemplary embodiment.
Figure 3:
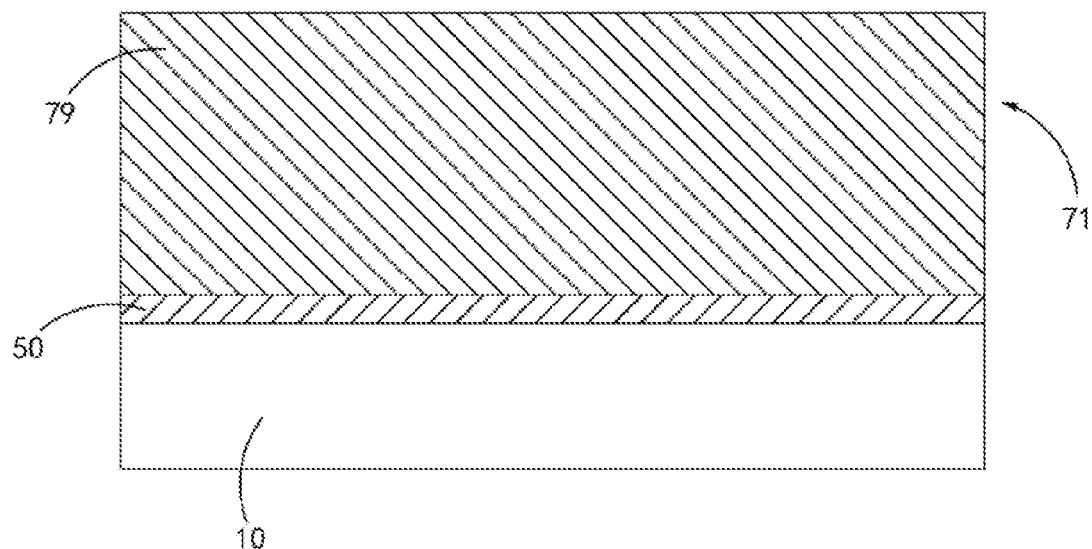
FIG. 3 is a structural schematic diagram of a second viewing angle of an isolating part formed by a method for preparing a semiconductor structure according to an exemplary embodiment.

Specifically, the isolating part 71 is formed on the substrate 10. As shown in FIG. 2 and FIG. 3, the isolating part 71 covers an upper surface of the substrate 10. The isolating part 71 includes an insulating material, for example, silicon nitride, silicon oxide and so on.

In some embodiments, reference is made to FIG. 2 and FIG. 3, the isolating part 71 includes a bit line side wall layer 50 and a second insulating layer 79, the bit line side wall layer 50 is located on the substrate 10 and is buried in the second insulating layer 79, and a bit line 40 is formed in the bit line side wall layer 50.

Specifically, the bit line 40 is buried in the isolating part 71 and the bit line side wall layer 50 covers the upper surface of the substrate 10 and the side wall and the top wall of the bit line 40 to form a side wall isolating structure of the bit line 40.

As shown in FIG. 2, the bit line 40 includes a bit line metal layer 41, a bit line connecting layer 42 and a bit line protecting layer 43. The bit line connecting layer 42 is connected with the substrate 10, the bit line metal layer 41 is located on the bit line connecting layer 42 and the bit line protecting layer 43 is located on the bit line metal layer 41. The bit line metal layer 41 may include tungsten. The bit line connecting layer 42 may include polycrystalline silicon. The bit line protecting layer 43 may include at least one of silicon nitride and silicon carbide nitride.

It is to be noted that the specific forming modes of the isolating part 71 and the bit line 40 are not defined herein and the isolating part 71 and the bit line 40 may be formed according to a method in the related technology. In the embodiment, the substrate formed with the bit line 40 and the isolating part 71 may be provided directly, thereby forming the storage node contact 20 and the capacitor isolating structure 30 on this basis.

In some embodiments, the bit line side wall layer 50 may include, but is not limited to, silicon nitride, silicon nitride/silicon oxide/silicon nitride, silicon carbide nitride and the like. The second insulating layer 79 may include silicon dioxide. The second insulating layer 79 is filled in isolating spaces formed by the bit line side wall layer 50, please refer to FIG. 2 for details.

Figure 4:
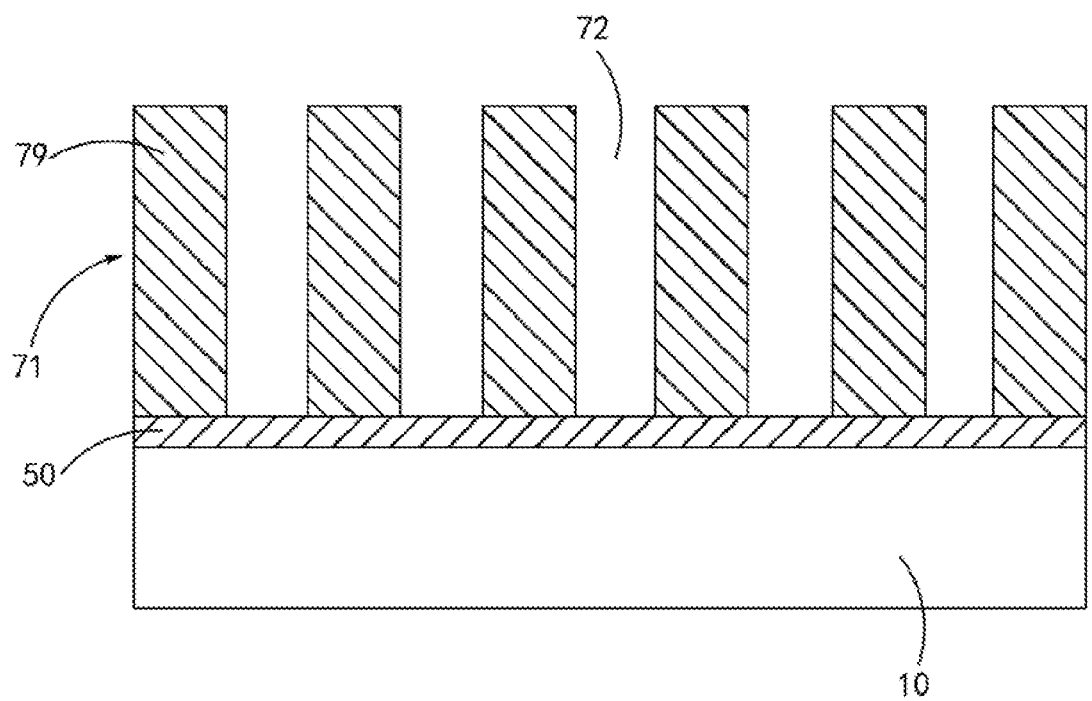
FIG. 4 is a structural schematic diagram illustrating that a trench is formed by a method for preparing a semiconductor structure according to an exemplary embodiment.

On the basis of FIG. 3, the isolating part 71 is etched, and a plurality of trenches 72 are formed in the isolating part 71, as shown in FIG. 4. In the embodiment, the isolating part 71 is etched on the substrate 10 via a pitch multiplication technology or other pattern transfer technologies. The dimension of the trench 72 is determined according to an actual demand. In the embodiment, the dimension of the opening of the trench 72 is 10-50 nm and a depth of the trench is 250-350 nm.

Specifically, the substrate 10 is covered by the bit line side wall layer 50, the second insulating layer 79 of the isolating part 71 is etched and etching is stopped after the bit line side wall layer 50 is exposed, thereby forming the trenches 72. In the embodiment, the bit line side wall layer 50 forms a bottom wall of each trench 72.

Figure 5:
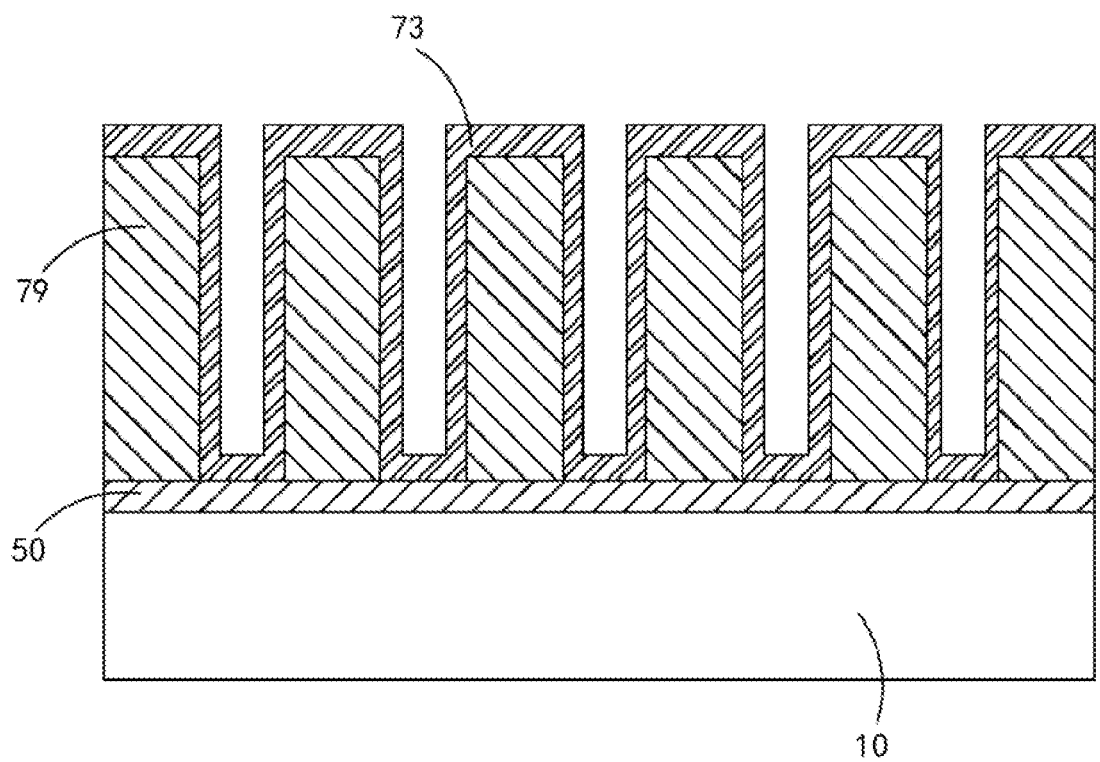
FIG. 5 is a structural schematic diagram illustrating that a first isolating dielectric layer is formed by a method for preparing a semiconductor structure according to an exemplary embodiment.

On the basis of FIG. 4, the first isolating dielectric layer 73 is formed on the side wall and the bottom wall of the trench 72, and the first isolating dielectric layer 73 further covers the top of the isolating part 71, and specifically covers the second insulating layer 79, as shown in FIG. 5.

Specifically, the first isolating dielectric layer 73 may be formed by a Physical Vapor Deposition (PVD) process, a Chemical Vapor Deposition (CVD) process or an Atomic Layer Deposition (ALD) process and etc. In the embodiment, the first isolating dielectric layer 73 is grown by the ALD process, and a thickness of the first isolating dielectric layer 73 may be 8-16 nm.

In some embodiments, the first isolating dielectric layer 73 may include, but is not limited to, silicon nitride, silicon nitride/silicon oxide/silicon nitride, silicon carbide nitride structure and the like. In the embodiment, the material of the first isolating dielectric layer 73 may be same as the material of the bit line side wall layer 50.

Figure 6:
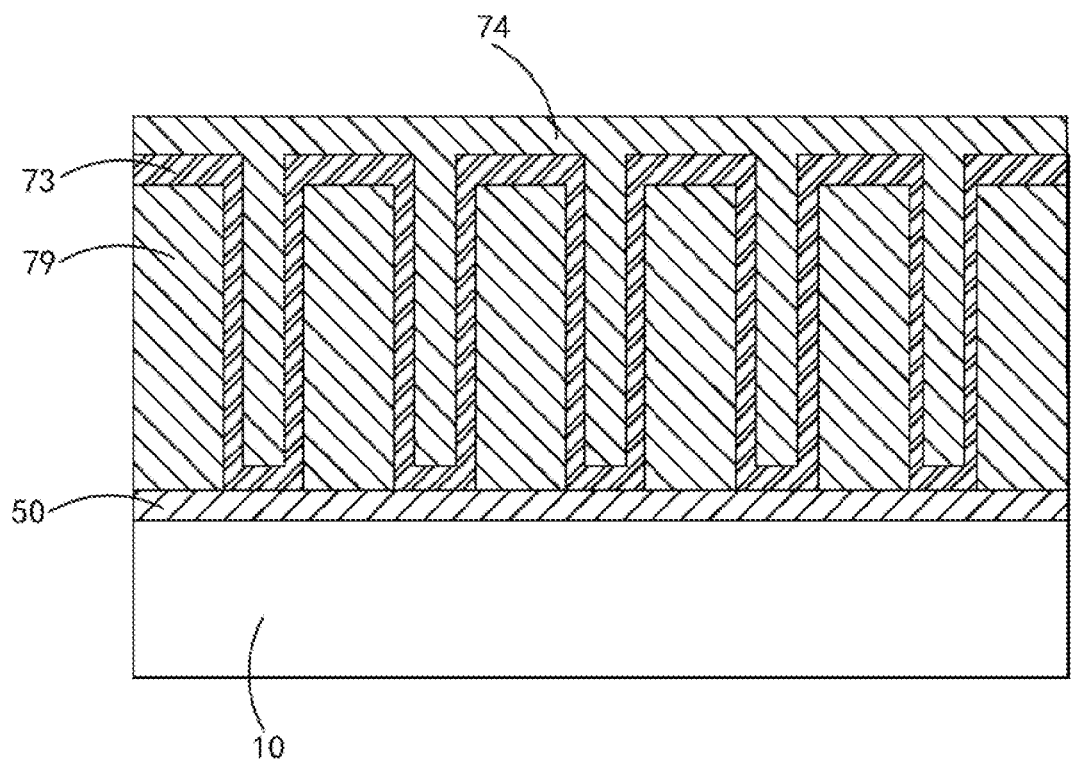
FIG. 6 is a structural schematic diagram illustrating that a first insulating layer is formed by a method for preparing a semiconductor structure according to an exemplary embodiment.

On the basis of FIG. 5, the first insulating layer 74 is formed on the first isolating dielectric layer 73, and the first insulating layer 74 fills up the trench 72 and covers the first isolating dielectric layer 73 located above the second insulating layer 79, as shown in FIG. 6.

Specifically, the first insulating layer 74 may be formed by the PVD process, the CVD process or the ALD process and etc. In the embodiment, the first insulating layer 74 is formed by the ALD process, and the grown thickness of the first insulating layer 74 may be 3-7 nm.

In some embodiments, the first insulating layer 74 includes, but is not limited to, silicon dioxide.

Figure 7:
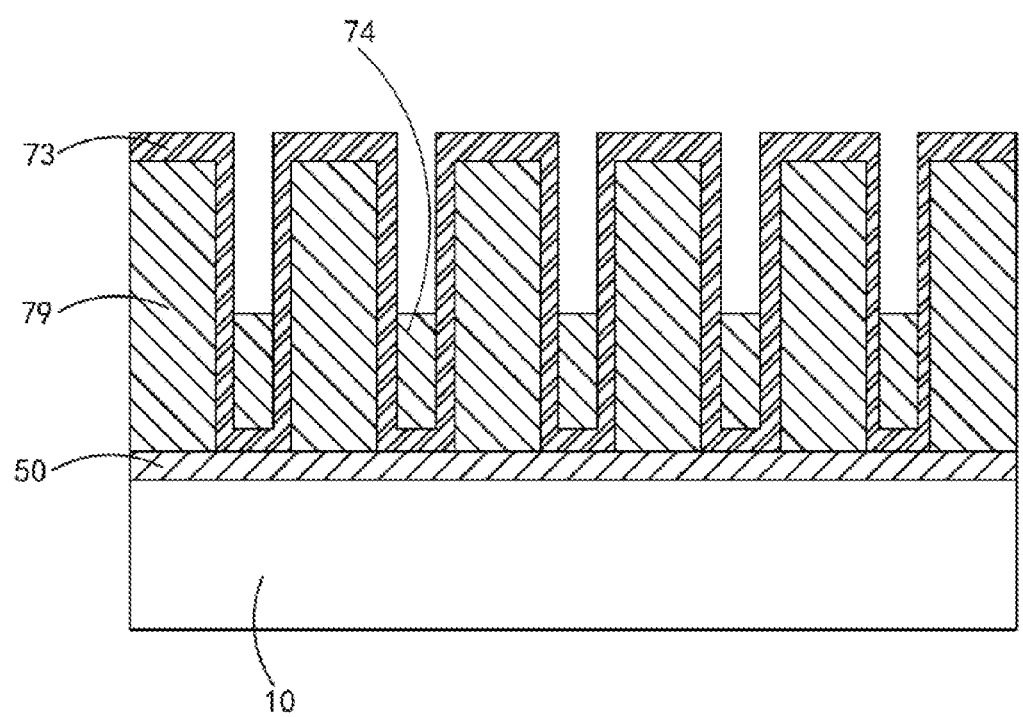
FIG. 7 is a structural schematic diagram illustrating that a part of insulating layer is removed according to a method for preparing a semiconductor structure according to an exemplary embodiment.

On the basis of FIG. 6, the first insulating layer 74 outside the trench 72 is removed and a part of first insulating layer 74 in each trench 72 is removed to form the structure as shown in FIG. 7.

In the embodiment, the part of first insulating layer 74 is removed by adopting a wet etching process, and a height of the remaining first insulating layer 74 is 110-140 nm. It is to be noted that a reserved height of the first insulating layer 74 needs to be higher than the height of the bit line metal layer 41, thereby reducing the inductive coupling effect between the metal layers.

Figure 8:
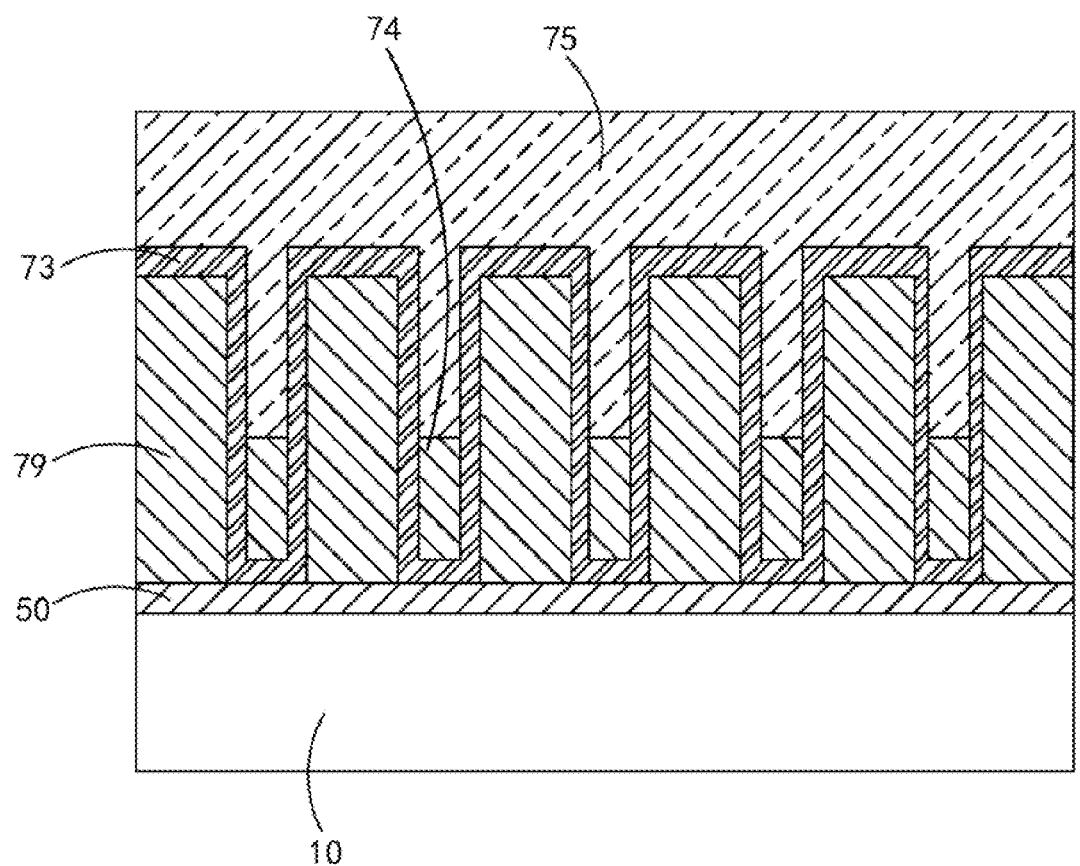
FIG. 8 is a structural schematic diagram illustrating that a second isolating dielectric layer is formed by a method for preparing a semiconductor structure according to an exemplary embodiment.

On the basis of FIG. 7, the second isolating dielectric layer 75 is formed on the first isolating dielectric layer 73 and the first insulating layer 74, and the second isolating dielectric layer 75 fills up the trench 72 and covers the top of the first isolating dielectric layer 73, as shown in FIG. 8.

Specifically, the second isolating dielectric layer 75 may be formed by the PVD process, the CVD process or the ALD process and etc. In the embodiment, the second isolating dielectric layer 75 is formed by the ALD process, and a grown thickness of the second isolating dielectric layer 75 may be 25-35 nm.

In some embodiments, the second isolating dielectric layer 75 may include, but is not limited to, silicon nitride, silicon nitride/silicon oxide/silicon nitride, silicon carbide nitride and the like. In the embodiment, the material of the second isolating dielectric layer 75 may be same as the material of the first isolating dielectric layer 73.

Figure 9:
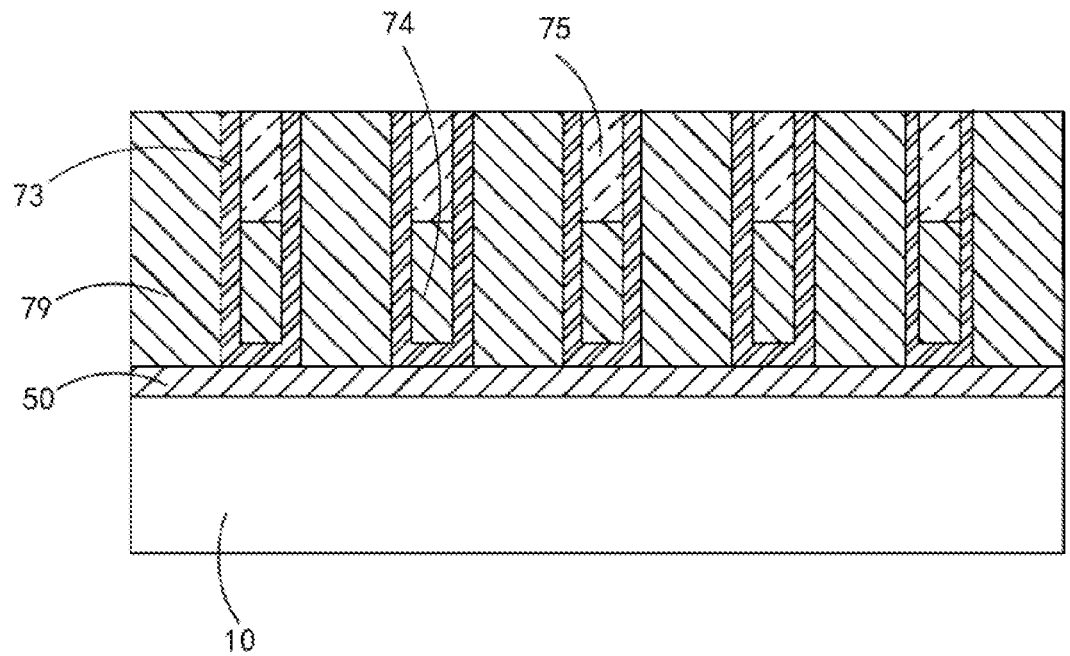
FIG. 9 is a structural schematic diagram illustrating that a part of second isolating dielectric layer is removed according to a method for preparing a semiconductor structure according to an exemplary embodiment.

On the basis of FIG. 8, a part of the second isolating dielectric layer 75, a part of the first isolating dielectric layer 73 and a part of the second insulating layer 79 are removed to form the structure as shown in FIG. 9.

Specifically, the entire structure is etched together by a dry etching process, the remaining overall height is 150-160 nm and the remaining thickness of the second isolating dielectric layer 75 is 20-40 nm.

Figure 10:
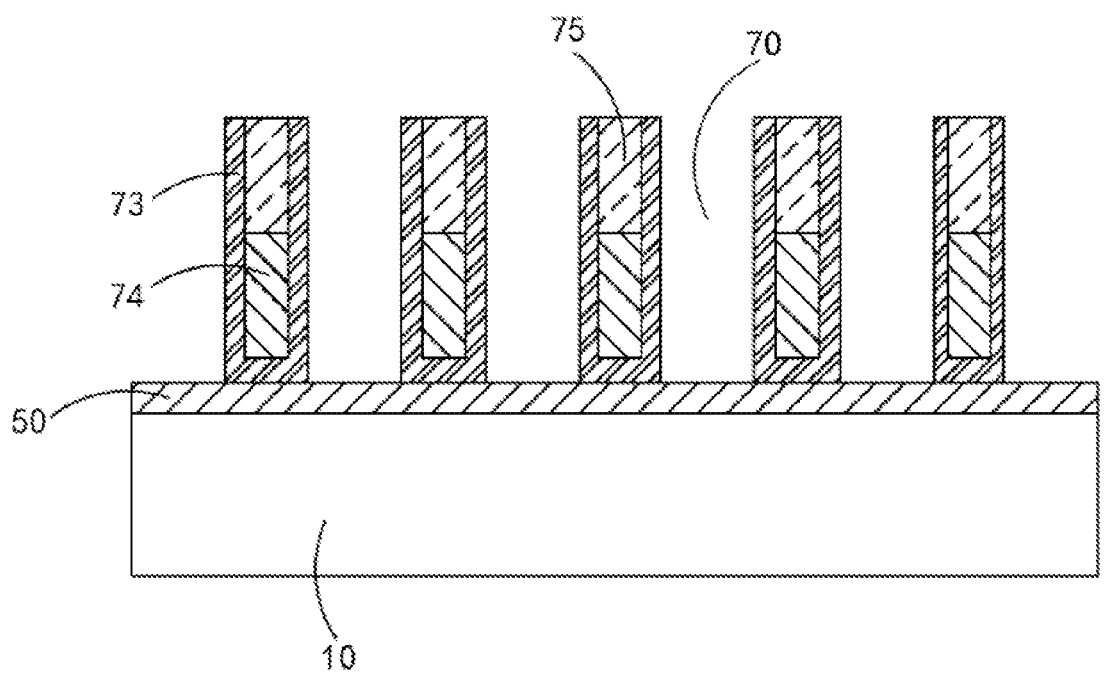
FIG. 10 is a structural schematic diagram illustrating that a first opening is formed according to a method for preparing a semiconductor structure according to an exemplary embodiment.

On the basis of FIG. 9, the second insulating layer 79 on each of two sides of each first isolating dielectric layer 73 is removed so as to form a plurality of first openings 70 as shown in FIG. 10. Due to the remaining second isolating dielectric layer 75, the first insulating layer 74 will not be cleaned away.

Specifically, the second insulating layer 79 is removed by wet etching.

On the basis of FIG. 10, the storage node contacts 20 are formed on the substrate 10. A part of each of the storage node contacts 20 is formed in the first opening 70, as shown in FIG. 11.

Figure 11:
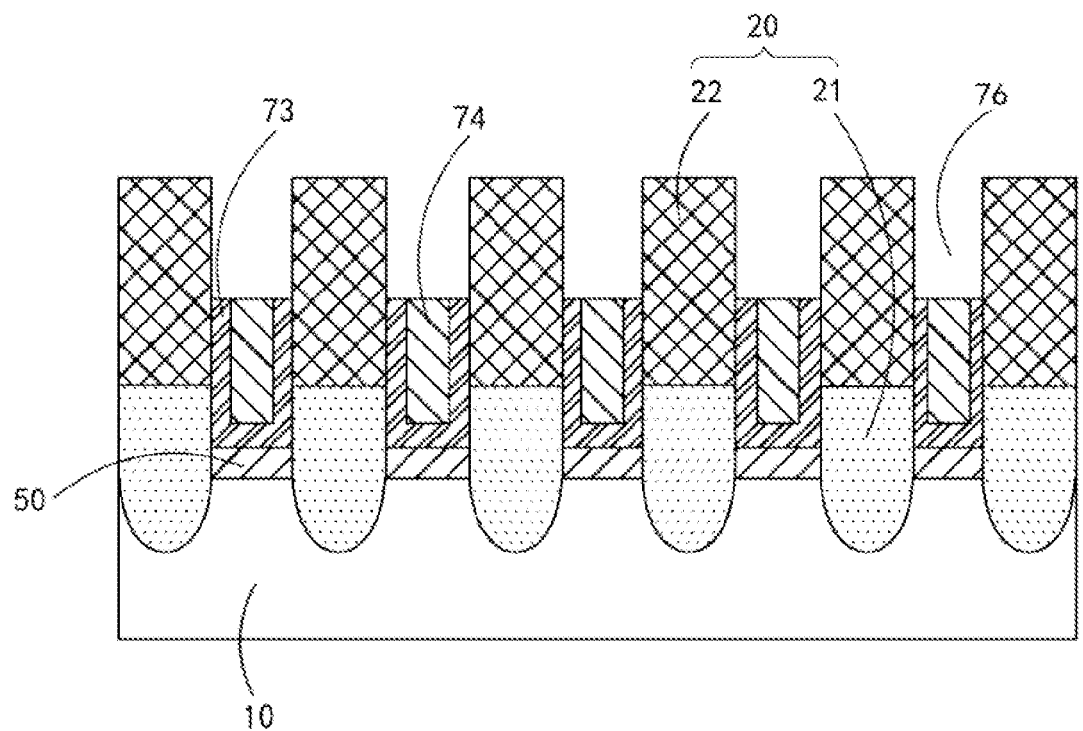
FIG. 11 is a structural schematic diagram illustrating that storage node contacts are formed according to a method for preparing a semiconductor structure according to an exemplary embodiment.

In some embodiments, as illustrated in FIG. 11, the storage node contact 20 includes a semiconductor layer 21 and a metal layer 22, a bottom end of the semiconductor layer 21 being located in the substrate 10 and the metal layer 22 being located at a top end of the semiconductor layer 21.

It is to be noted that the specific forming method of the storage node contacts 20 is not defined herein and the storage node contacts 20 may be formed according to known methods in the related art. For example, a hole is formed in the substrate 10, the semiconductor layer 21 is formed in the hole of the substrate and at the bottom of the first opening 70, and then the metal layer 22 is formed on the semiconductor layer 21.

In some embodiments, the semiconductor layer 21 may include materials such as a cobalt silicon compound and polycrystalline silicon. The metal layer 22 may include materials such as metallic tungsten and titanium nitride. The metal layer 22 may further be divided into a metal layer and a contact plate.

In an embodiment, the operation that the first air gap 31 is formed includes the following operations. The second isolating dielectric layer 75 located above the first insulating layer 74 and the first isolating dielectric layer 73 on each of side walls of the second isolating dielectric layer 75 are removed, to form a second opening 76 between adjacent two storage node contacts 20. A third isolating dielectric layer 77 is formed in the second opening 76, covers a side wall of the second opening 76 and is abutted against a top end of the first isolating dielectric layer 73. The first insulating layer 74 is removed to form the first air gap 31 between the first isolating dielectric layer 73 and the third isolating dielectric layer 77. The first isolating dielectric layer 73, the third isolating dielectric layer 77 and the first air gap 31 serve as the capacitor isolating structures 30.

Specifically, after the storage node contacts 20 are formed, the second isolating dielectric layer 75 located above the first insulating layer 74 and the first isolating dielectric layer 73 on each of the side walls of the second isolating dielectric layer 75 are removed, to form the second opening 76 between adjacent two storage node contacts 20, as shown in FIG. 11. At the moment, the top end of the metal layer 22 is higher than the top end of the first isolating dielectric layer 73. The second isolating dielectric layer 75 and the first isolating dielectric layer 73 may be removed by adopting a wet etching process. It is to be noted that the second isolating dielectric layer 75 is removed fully to expose the first insulating layer 74.

Figure 15:
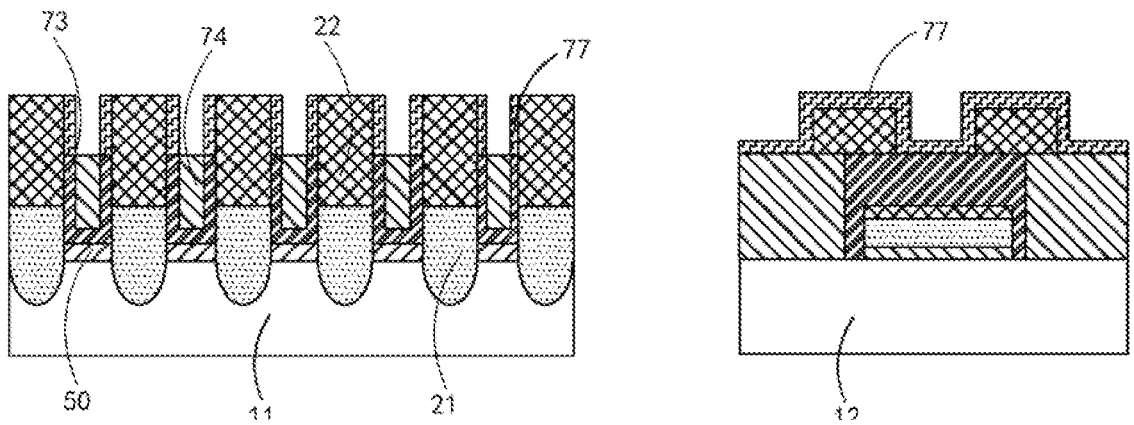
FIG. 15 is a structural schematic diagram illustrating that a mask layer in the peripheral circuit region is removed by a method for preparing a semiconductor structure according to an exemplary embodiment.
Figure 16:
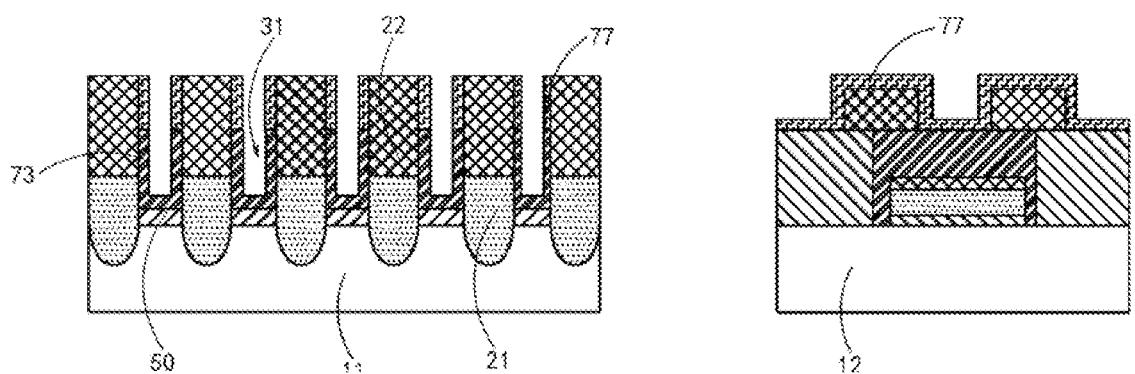
FIG. 16 is a structural schematic diagram illustrating that a first air gap is formed by a method for preparing a semiconductor structure according to an exemplary embodiment.

On the basis of FIG. 11, the third isolating dielectric layer 77 is formed, and the third isolating dielectric layer 77 covers top ends of the first isolating dielectric layers 73 and of the first insulating layers 74 and covers top ends of the metal layers 22. Then, the third isolating dielectric layer 77 at each of the top ends of the metal layers 22 and the third isolating dielectric layer 77 at each of the top ends of the first insulating layers 74 are removed to form the structure as shown in FIG. 15. Finally, the first insulating layers 74 are removed to form the first air gaps 31 as shown in FIG. 16.

In an embodiment, the substrate 10 includes a storage unit region 11 and a peripheral circuit region 12. The storage node contacts 20 are formed in the storage unit region 11. Each of the storage unit region 11 and the peripheral circuit region 12 is formed with the third isolating dielectric layer 77 and the third isolating dielectric layer 77 covers the top ends of the storage node contacts 20 and the top ends of the first insulating layers 74. The peripheral circuit region 12 is formed with a mask layer 78 to cover the third isolating dielectric layer 77 located in the peripheral circuit region 12 and is used to etch the third isolating dielectric layer 77 at each of the top ends of the storage node contacts 20 and at each of the top ends of the first insulating layers 74, so that the third isolating dielectric layer 77 in the storage unit region 11 only covers the side wall of the second opening 76.

It is to be noted that the specific structure of the peripheral circuit region 12 is not defined herein and may be a known structure in the related art. The embodiment puts an emphasis on covering the peripheral circuit region 12 by the third isolating dielectric layer 77 in the process of forming the third isolating dielectric layer 77.

It is to be noted that the peripheral circuit region 12 is not shown in FIG. 2 to FIG. 11, but is shown in FIGS. 12-17 after the storage node contacts 20 of FIG. 11 are formed.

Figure 12:
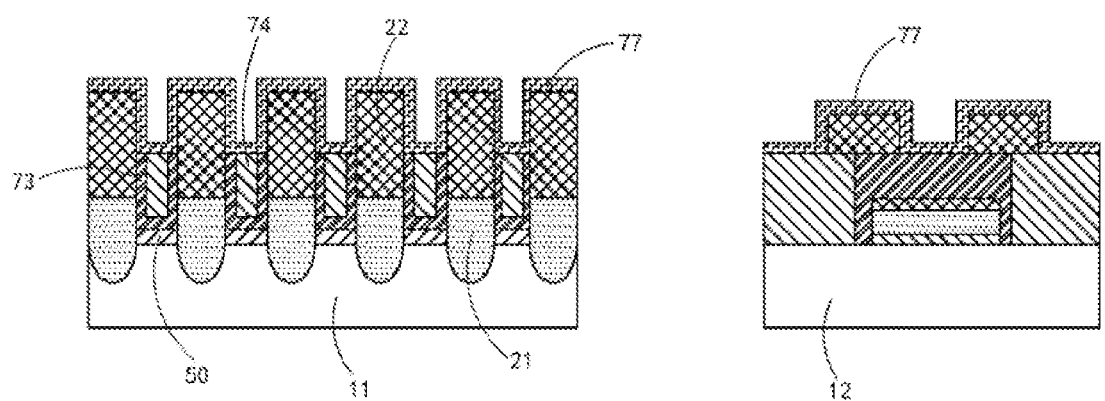
FIG. 12 is a structural schematic diagram illustrating that a third isolating dielectric layer is formed according to a method for preparing a semiconductor structure according to an exemplary embodiment.

On the basis of FIG. 11, the third isolating dielectric layer 77 as shown in FIG. 12 is formed in the storage unit region 11 and the peripheral circuit region 12.

Specifically, the third isolating dielectric layer 77 may be formed by the PVD process, the CVD process or the ALD process and etc. In the embodiment, the third isolating dielectric layer 77 is formed by the ALD process, and a grown thickness of the third isolating dielectric layer 77 may be 2-4 nm.

In some embodiments, the third isolating dielectric layer 77 may include, but is not limited to, silicon nitride, silicon nitride/silicon oxide/silicon nitride, silicon carbide nitride and the like. In the embodiment, the material of the third isolating dielectric layer 77 may be same as the first isolating dielectric layer 73.

Figure 13:
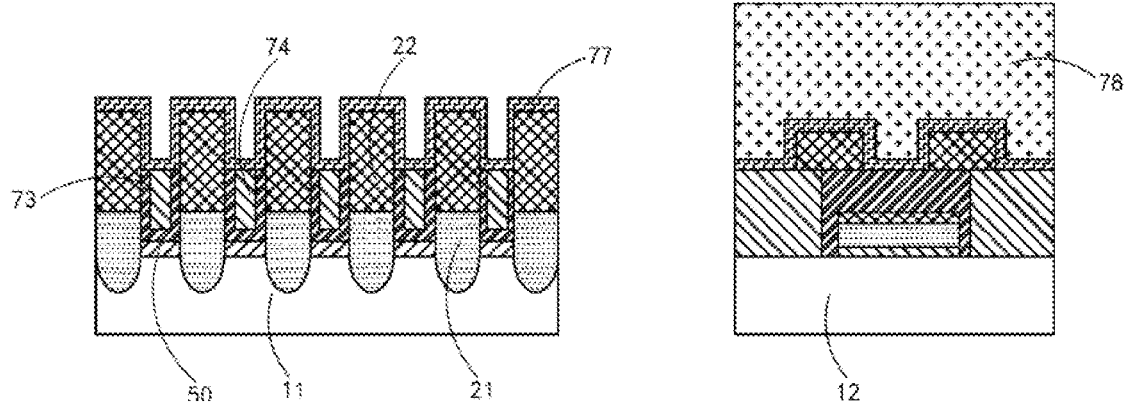
FIG. 13 is a structural schematic diagram illustrating that a mask layer is formed in a peripheral circuit region by a method for preparing a semiconductor structure according to an exemplary embodiment.

On the basis of FIG. 12, the mask layer 78 is formed in the peripheral circuit region 12 and the mask layer 78 covers the third isolating dielectric layer 77 in the peripheral circuit region 12, as shown in FIG. 13.

Specifically, the mask layer 78 may be a photoresist that protects the peripheral circuit region 12 from being damaged by a subsequent manufacturing process.

Figure 14:
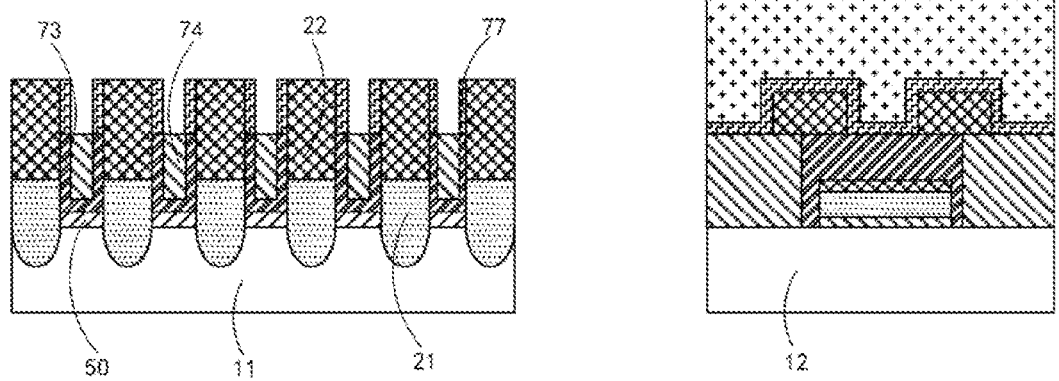
FIG. 14 is a structural schematic diagram illustrating that a part of third isolating dielectric layer is removed by a method for preparing a semiconductor structure according to an exemplary embodiment.

On the basis of FIG. 13, the third isolating dielectric layer 77 at the top ends of the metal layers 22 and at the top ends of the first insulating layers 74 is etched to form the structure as shown in FIG. 14. Specifically, the third isolating dielectric layer 77 in the storage unit region 11 is opened by a dry etching technology and the structure of the third isolating dielectric layer 77 on the side wall is only reserved.

The mask layer 78 shown in FIG. 14 is removed to form the structure as shown in FIG. 15, and at this moment, the entire third isolating dielectric layer 77 in the peripheral circuit region 12 is reserved.

On the basis of FIG. 15, the first insulating layers 74 are removed so as to form the structure as shown in FIG. 16. Specifically, the first insulating layers 74 are removed by a wet etching method with a high selection ratio, such that a structure having empty slots is formed, that is, the first air gaps 31 are formed.

In an embodiment, the method for preparing a semiconductor structure further includes the following operation. A sealing layer 60 is formed on the first air gaps 31, the sealing layer 60 covers the storage node contacts 20 and the sealing layer 60 is configured to close openings at top ends of the first air gaps 31.

Figure 17:
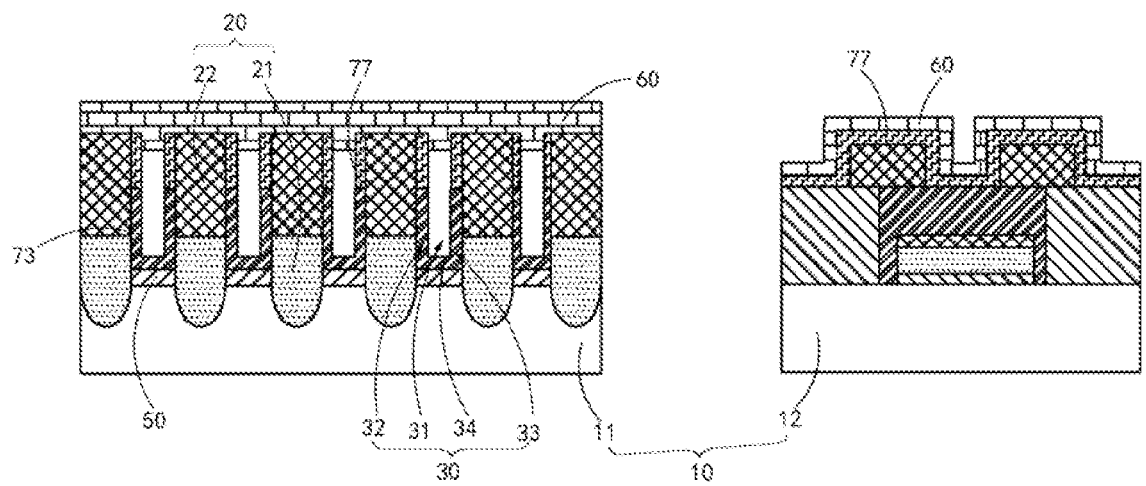
FIG. 17 is a structural schematic diagram illustrating that a sealing layer is formed by a method for preparing a semiconductor structure according to an exemplary embodiment.

Specifically, On the basis of FIG. 16, the sealing layer 60 grows on the surface by a plasma chemical vapor deposition method to form a structure shown in FIG. 17. Due to its high deposition rate and good sealing effect, it can ensure that a cavity structure (i.e., the first air gaps 31) that has been formed is not filled.

In some embodiments, the sealing layer 60 may include, but is not limited to, silicon nitride, silicon nitride/silicon oxide/silicon nitride, silicon carbide nitride and the like. In the embodiment, the sealing layer 60 and the third isolating dielectric layer 77 may be same in material.

In an embodiment, the substrate 10 is filled with a isolating part 71, the isolating part 71 is internally provided with bit lines 40, and a first opening 70 is formed between the two bit lines 40.

In an embodiment, the isolating part 71 includes a bit line side wall layer 50 and a second insulating layer 79, the bit line side wall layer 50 is located on the substrate 10 and is buried in the second insulating layer 79, and the bit line side wall layer 50 is formed with the bit lines 40. The second insulating layer 79 forms the two opposite side walls of the trench 72, and the second insulating layer 79 on each of two sides of each first isolating dielectric layer 73 is removed to form the first openings 70.

In an embodiment, the trench 72 is a rectangular hole, and the bit line side wall layer 50 forms the bottom wall and the two opposite side walls of the trench 72.

In an embodiment, the isolating part 71 includes a bit line side wall layer 50 and a second insulating layer 79, the bit line side wall layer 50 is located on the substrate 10 and is buried in the second insulating layer 79, first openings 70 are formed in the second insulating layer 79, and the bit line side wall layer 50 forms two opposite side walls of the first air gap 31.

Figure 18:
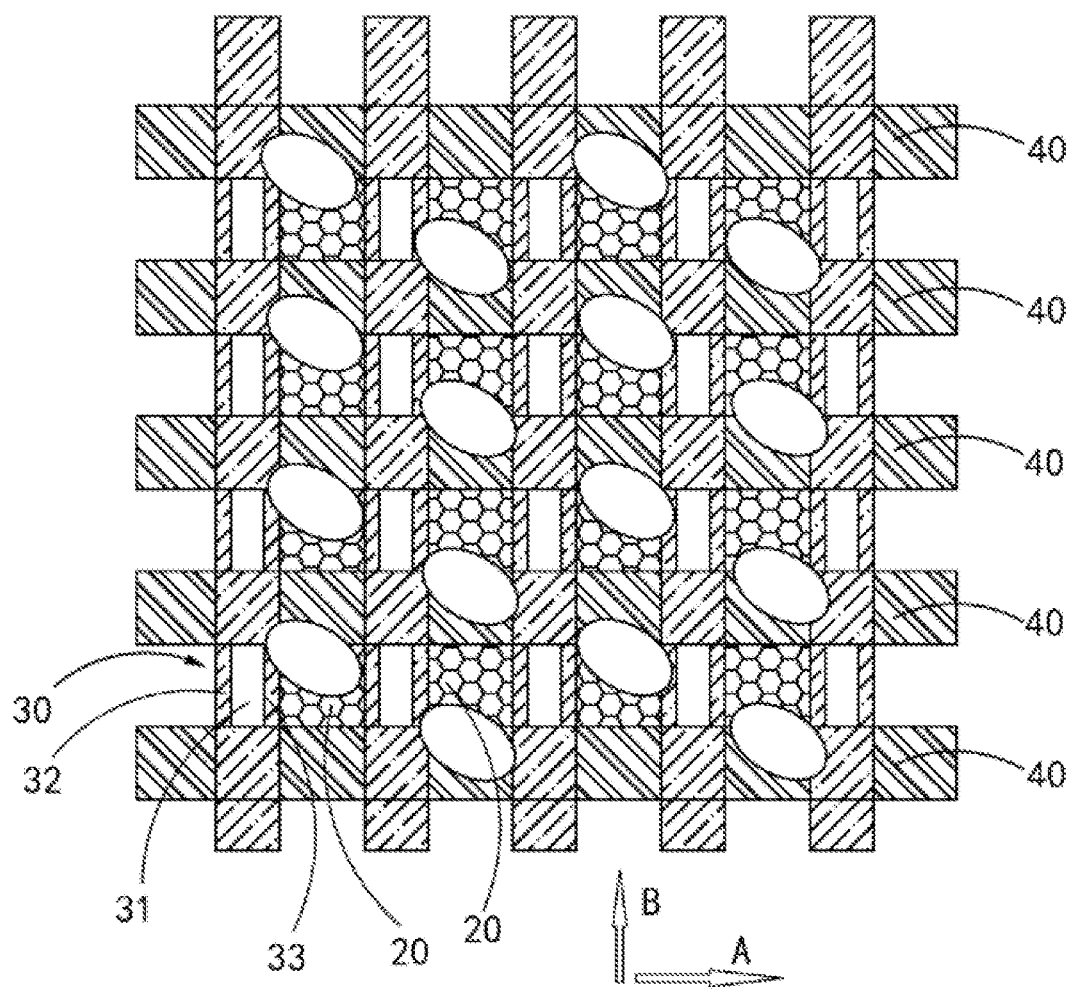
FIG. 18 is a top view of a semiconductor structure according to an exemplary embodiment.

An embodiment of the disclosure further provides a semiconductor structure. Referring to FIG. 17 and FIG. 18, the semiconductor structure includes a substrate 10, storage node contacts 20 and capacitor isolating structures 30. The storage node contacts 20 are located on the substrate 10. Each capacitor isolating structure 30 is located on the substrate 10, covers a side wall of the storage node contact 20 and includes a first air gap 31.

The semiconductor structure of an embodiment of the disclosure includes the substrate 10, the storage node contacts 20 and the capacitor isolating structures 30. The capacitor isolating structure 30 covers the side wall of the storage node contact 20. The capacitor isolating structure 30 includes the first air gap 31. In such a way, an inductive coupling effect is reduced and performance of the semiconductor structure is improved.

In an embodiment, as shown in FIG. 17, the storage node contact 20 includes a semiconductor layer 21 and a metal layer 22, the bottom end of the semiconductor layer 21 being located in the substrate 10 and the metal layer 22 being located at the top end of the semiconductor layer 21. The semiconductor layer 21 is protected by the capacitor isolating structure 30, which facilitates isolating risk of potential oxidization and pollution, and thus it is easier to manufacture on a large scale.

In an embodiment, as shown in FIG. 17 and FIG. 18, the capacitor isolating structure further includes a first isolating layer 32 located on the substrate 10 and a second isolating layer 33 located on the substrate 10. The first isolating layer 32 and the second isolating layer 33 are spaced apart from each other to form the first air gap 31 between the first isolating layer 32 and the second isolating layer 33, that is, the capacitor isolating structure 30 forms an insulating structure of an isolating layer-an air layer-an isolating layer, thereby improving the insulating effect.

It is to be noted that the first isolating layer 32 is as high as the second isolating layer 33. The first air gap 31 may be as high as each of the first isolating layer 32 and the second isolating layer 33, or, the first air gap 31 may be lower than each of the first isolating layer 32 and the second isolating layer 33.

In an embodiment, as shown in FIG. 17, the capacitor isolating structure 30 further includes a third isolating layer 34, the third isolating layer 34 being located on the substrate 10 and two ends of the third isolating layer 34 being respectively connected to a bottom end of the first isolating layer 32 and a bottom end of the second isolating layer 33. The first air gap 31 is located above the third isolating layer 34.

Specifically, the first isolating layer 32, the third isolating layer 34 and the second isolating layer 33 form a U-shaped electrical isolating structure. A space encircled by the first isolating layer 32, the third isolating layer 34 and the second isolating layer 33 is the first air gap 31, such that the capacitor isolating structure 30 includes air isolation, thereby improving the isolating capacity of the capacitor isolating structure 30, reducing the inductive coupling effect and improving the performance of the semiconductor structure.

In an embodiment, there are at least two capacitor isolating structures 30 and the storage node contact 20 is located between the adjacent two capacitor isolating structures 30. The first isolating layer 32 of one of the capacitor isolating structures 30 covers a first side wall of the storage node contact 20 and the second isolating layer 33 of the other one of the capacitor isolating structures covers a second side wall of the storage node contact 20.

It may be seen in combination with FIG. 17 and FIG. 18 that the capacitor isolating structure 30 is sandwiched between adjacent two storage node contacts 20 to form isolation, that is, the first air gaps 31 is included between the each two adjacent storage node contacts 20.

In an embodiment, there are a plurality of storage node contacts 20 and there are a plurality of capacitor isolating structures 30. The semiconductor structure further includes: a bit line 40 located on the substrate 10 and extending along a first direction, and the storage node contacts 20 and the capacitor isolating structures 30 are arranged in a staggered manner along the first direction. There are a plurality of bit lines 40 spaced apart from each other along a second direction. The first direction is parallel to the substrate 10, the second direction is parallel to the substrate 10, and the first direction is perpendicular to the second direction. The storage node contact 20 is arranged between the adjacent two bit lines 40.

Specifically, as shown in FIG. 18, A represents the first direction and B represents the second direction. The plurality of bit lines 40 are arranged on the substrate 10 and extend along the first direction A. The plurality of bit lines 40 are spaced apart from each other along the second direction and some storage node contacts 20 are sandwiched between adjacent two bit lines 40. The first direction is parallel to the substrate 10 and the second direction is parallel to the substrate 10, which may be interpreted that the first direction and the second direction are parallel to the upper surface of the substrate 10.

In an embodiment, the semiconductor structure further includes: the bit line side wall layer 50, the bit line side wall layer 50 being located on the substrate 10 and covers the side walls of the bit lines 40, i.e., the bit line side wall layer 50 is configured to isolate the adjacent two bit lines 40 from each other.

According to a basic structure of the bit lines 40 and the bit line side wall layer 50, the bit line side wall layer 50 covers the upper surface of the substrate 10 and the bit lines 40 are located in the bit line side wall layer 50.

The bit line 40 includes a bit line metal layer 41, a bit line connecting layer 42 and a bit line protecting layer 43, the bit line connecting layer 42 being connected to the substrate 10, the bit line metal layer 41 being located on the bit line connecting layer 42 and the bit line protecting layer 43 being located on the bit line metal layer 41. The top end of the first air gap 31 is not lower than the top end of the bit line metal layer 41, thereby guaranteeing that the first air gap 31 has an enough isolating capacity.

In some embodiments, the first air gap 31 may be formed in a middle portion of the capacitor isolating structure 30, i.e., each side wall of the first air gap 31 may be formed by the isolating layer of the capacitor isolating structure 30, in this case, the first isolating layer 32 and the second isolating layer 33 form a circumferentially closed structure and the first air gap 31 is formed in the middle thereof.

In some embodiments, the third isolating layer 34 of the capacitor isolating structure 30 and the bit line side wall layer 50 are different in growth step but are the same in material.

In an embodiment, as shown in FIG. 17, the semiconductor structure further includes a sealing layer 60, the sealing layer 60 being located at the top ends of the capacitor isolating structures 30 and configured to seal the first air gaps 31.

In an embodiment, the semiconductor structure may be obtained by the method for preparing the semiconductor structure.

It is to be noted that the material of each structural layer included by the semiconductor structure may refer to the material given by the method for preparing the semiconductor structure, which is no longer described in detail. For example, the first isolating layer 32 and the second isolating layer 33 each include the first isolating dielectric layer 73 and the third isolating dielectric layer 77, and the third isolating layer 34 includes the first isolating dielectric layer 73.

Other implementation solutions of the present disclosure will be apparent to those skilled in the art from consideration of the specification and practice of the present disclosure. The disclosure is intended to cover any variations, uses, or adaptations of the present disclosure following the general principles thereof and including such departures from the disclosure as come within known or customary practice in the art. It is intended that the specification and example implementations be considered as exemplary only, with a true scope and spirit of the disclosure being indicated by the foregoing claims.

It should be understood that the disclosure is not limited to the exact construction that has been described above and illustrated in the accompanying drawings, and that various modifications and changes may be made without departing from the scope thereof. The scope of the disclosure is limited only by the appended claims.

The invention claimed is:

1. A semiconductor structure, comprising:
   a substrate;
   a plurality of storage node contacts located on the substrate;
   a plurality of capacitor isolating structures that respectively located on the substrate between adjacent storage node contacts of the plurality of storage node contacts;
   a plurality of bit lines located on the substrate and extending in a first direction, wherein the plurality of storage node contacts and the plurality of capacitor isolating structures are arranged in a staggered manner in the first direction, wherein the plurality of bit lines spaced apart from each other in a second direction, the first direction being parallel to the substrate, the second direction being parallel to the substrate, the first direction being perpendicular to the second direction, and the plurality of storage node contacts that respectively arranged between adjacent bit lines of the plurality of bit lines;
   a bit line side wall layer located on the substrate and covering a side wall of each of the bit lines; and
   at least one capacitor isolating structure of the plurality of capacitor isolating structures comprising a first air gap, a first isolating layer and a second isolating layer located on the substrate, wherein the first isolating layer, the second isolating layer and the bit line side wall layer are spaced apart from each other to form the first air gap between the first isolating layer, the second isolating layer and the bit line side wall layer, wherein the first isolating layer covers a first side wall of at least one storage node contact of the plurality of storage node contacts and the second isolating layer covers a second side wall of at least one storage node contact of the plurality of storage node contacts, wherein the first side wall and the second side wall are arranged relative to each other.

2. The semiconductor structure according to claim 1, wherein at least one capacitor isolating structure further comprises:
   a third isolating layer located on the substrate, wherein two ends of the third isolating layer are respectively connected to a bottom end of the first isolating layer and a bottom end of the second isolating layer, and
   wherein the first air gap is located above the third isolating layer.

3. The semiconductor structure according to claim 2, wherein the first isolating layer, the third isolating layer and the second isolating layer form a U-shaped electrical isolating structure.

4. The semiconductor structure according to claim 1, wherein each of the plurality of the bit lines comprises a bit line metal layer, a bit line connecting layer and a bit line protecting layer, the bit line connecting layer being connected to the substrate, the bit line metal layer being located on the bit line connecting layer and the bit line protecting layer being located on the bit line metal layer.

5. The semiconductor structure according to claim 1, wherein the semiconductor structure further comprises:
   a sealing layer located at a top end of the capacitor isolating structure and used for sealing the first air gap.

6. The semiconductor structure according to claim 2, wherein the semiconductor structure further comprises:
   a sealing layer located at a top end of each of the capacitor isolating structures and used for sealing the first air gap.

7. The semiconductor structure according to claim 1, wherein the first isolating layer and the second isolating layer are respectively comprising a first isolating dielectric layer and a third isolating dielectric layer, the first isolating dielectric layer and the third isolating dielectric layer covering a side wall of each storage node contact and the third isolating dielectric layer abutting against a top end of the first isolating dielectric layer.

8. The semiconductor structure according to claim 2, wherein the third isolating layer comprising a first isolating dielectric layer.

9. The semiconductor structure according to claim 7, the semiconductor structure future comprising:
   a sealing layer located at a top end of the third isolating dielectric layer and used for sealing the first air gap.

* * * * *